United States Patent
Rozen et al.

(10) Patent No.: US 7,971,105 B2
(45) Date of Patent: Jun. 28, 2011

(54) DEVICE AND METHOD FOR DETECTING AND CORRECTING TIMING ERRORS

(75) Inventors: Anton Rozen, Gedera (IL); Dan Kuzmin, Givat Shmuel (IL); Michael Priel, Hertzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 229 days.

(21) Appl. No.: 12/355,224

(22) Filed: Jan. 16, 2009

(65) Prior Publication Data
US 2010/0182055 A1  Jul. 22, 2010

(51) Int. Cl.
*G06F 11/00* (2006.01)
(52) U.S. Cl. ............... 714/55; 713/322; 713/500
(58) Field of Classification Search ........ 714/55; 713/322, 401, 500
See application file for complete search history.

(56) References Cited

U.S. PATENT DOCUMENTS

| | | | | |
|---|---|---|---|---|
| 6,735,732 | B2 * | 5/2004 | Yamada | 714/744 |
| 2004/0025069 | A1 | 2/2004 | Gary et al. | |
| 2004/0098634 | A1 * | 5/2004 | Zerbe et al. | 713/500 |
| 2005/0110545 | A1 * | 5/2005 | Mahrla | 327/165 |
| 2007/0152739 | A1 | 7/2007 | Banerjee et al. | |
| 2008/0105876 | A1 | 5/2008 | Han | |
| 2008/0120458 | A1 * | 5/2008 | Gillingham et al. | 711/105 |
| 2008/0186083 | A1 | 8/2008 | Rozen et al. | |
| 2008/0222435 | A1 | 9/2008 | Bolan et al. | |
| 2008/0244305 | A1 * | 10/2008 | Troppmann et al. | 713/601 |
| 2008/0265674 | A1 * | 10/2008 | Rozen et al. | 307/28 |
| 2009/0031155 | A1 * | 1/2009 | Hofmann et al. | 713/321 |
| 2010/0073836 | A1 * | 3/2010 | Arnold | 361/86 |
| 2010/0241282 | A1 * | 9/2010 | Culshaw et al. | 700/295 |

FOREIGN PATENT DOCUMENTS

| | | |
|---|---|---|
| GB | 2408356 A | 5/2005 |
| WO | 2006013484 A1 | 2/2006 |
| WO | 2006120507 A1 | 11/2006 |
| WO | 2007135487 A1 | 11/2007 |
| WO | 2007148159 A1 | 12/2007 |
| WO | 2008015495 A1 | 2/2008 |

* cited by examiner

*Primary Examiner* — Marc Duncan

(57) ABSTRACT

A device that includes an error detection circuit that is configured to detect a timing error resulting from a fast voltage drop by comparing a signal from a critical path to a signal from a replica path; and a clock signal provider that is adapted to receive a clock signal and to delay, by a fraction of the clock cycle and in response to a detection of the timing error, the clock signal to provide a delayed clock signal that is provided to a clocked circuit that is coupled to the critical path; and a controller that is configured determine a level of a supply voltage in response to a capability of the error detection circuit and the clock signal provider to manage fast voltage drops; wherein the supply voltage is provided to at least one component of the critical path.

20 Claims, 6 Drawing Sheets

---

Setting a level of a supply voltage to be supplied to at least one component of a critical path of a device, setting a frequency of a clock signal to be provided to clocked circuit that is connected to the critical path and providing the supply voltage and clock signal to at least the critical path.

— 510

Receiving a voltage supply by at least one components of a critical path and receiving a clock signal by at least one clocked components connected to the critical path.

— 520

Detecting a timing error resulting from a fast voltage drop by comparing a signal from the critical path to a signal from a replica path.

— 530

Delaying, by the clock signal provider, a clock signal, by a fraction of a cycle of the clock signal, and in response to the detecting of the timing error, to provide a delayed clock signal to a clocked circuit that is coupled to the critical path.

— 540

500

DEVICE AND METHOD FOR DETECTING AND CORRECTING TIMING ERRORS

FIELD OF THE INVENTION

The present invention relates to devices and methods for detecting and correcting timing errors and especially for detecting and correcting timing errors that result from fast voltage drops.

BACKGROUND OF THE INVENTION

Mobile devices or devices, such as but not limited to personal data appliances, cellular phones, radios, pagers, lap top computers, and the like are required to operate for relatively long periods before being recharged. These mobile devices usually include one or more processors as well as multiple memory modules and other peripheral devices.

In order to reduce the power consumption of mobile devices various power consumption control techniques were suggested. Differential voltage and frequency scaling (DVFS) reduces the power consumption of a component such as a processor by altering the supply voltage that is supplied to the processor as well as altering the frequency of a clock signal that is provided to the processor. The alteration is responsive to the computational load demands (also referred to as throughput) of the processor. Higher supply voltage levels are associated with higher operating frequencies and higher computational loads but are also associated with higher energy consumption.

When applying DVFS the level of the supply voltage should be set in response to fast voltage drops, static voltage drops, inaccuracies of a supply voltage provider (and especially a supply voltage regulator) and other factors. A fast voltage drop can happen when the computational load on the processor increases.

Accordingly, the supply voltage is higher (by a large margin) than a supply voltage that could have been provided to the processor if the mentioned factors were addressed.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
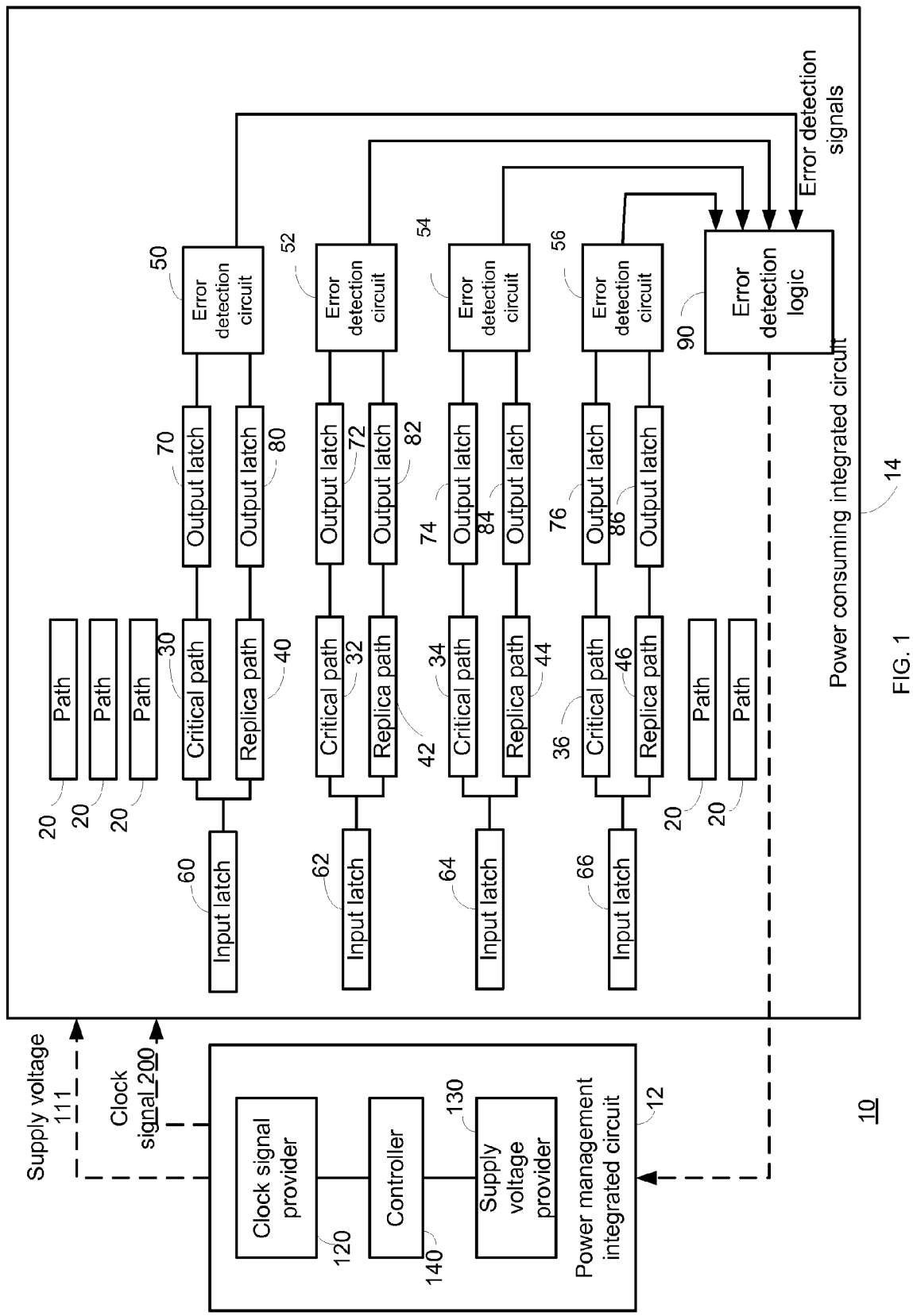
FIG. 1 illustrates an example of an embodiment of a device.

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

A path includes multiple logic components such as logic gates, delay units and the like. The input of the path is connected to an input latch. The output of a path can be connected to an output latch. The input latch can belong to an input flip flop and the output latch can belong to an output flip flop. The path usually does not include latches. The path applies a logic function on an input signal provided by the input latch and outputs an output signal. The output signal is sent to the output latch.

A critical path is a path that is more sensitive to fast voltage drops than other paths. A critical path is expected to generate more timing errors than a non-critical path if fast voltage drops occur. Typically, during a design phase of a device, the most sensitive paths are defined as critical paths. Their number is usually determined in advance and is usually a small fraction of the overall number of paths of a device.

A replica path is a path that is substantially equal to a critical path. A replica path and a corresponding critical path can apply the same logic function on an input signal provided to them. The replica path differs from the critical path by one or more parameters such as delay, threshold voltage and the like. The output of a replica path can be connected to an output latch, to an error detection circuit or both.

It has been shown that the supply voltage provided to a device (or at least some components of the device) can be reduced by detecting and correcting timing error resulting from fast voltage drops (hereinafter—timing errors). The timing errors are at least partially solved by delaying a clock signal that is provided to the device (or to some of its clocked components) by a fraction of a clock cycle. These clocked components can include latches that are connected to the critical path. In addition, the frequency of the clock signal and even the level of the supply voltage can be changed.

The capability of detecting, very quickly, such timing errors and correcting them allows a provision of a lower voltage supply to the paths.

A fast voltage drop can slow a path so that the path outputs an output signal later than expected. This slowing effect can result in a timing error as the output latch that is connected to the path can sample the wrong signal.

Such timing errors can be detected by introducing a difference between a replica path and a corresponding critical path and by comparing the signals outputted from each of these paths. The difference can be the delay period of each path, and additionally or alternatively, the sampling time of output signals of each path. For example, the replica path can be slightly slower than the critical path. Yet for another example, the output of the replica path can be sampled slightly before the output of the critical path is sampled.

By making the replica paths more sensitive to fast voltage drops the clock signal can be delayed before timing errors affect the critical paths.

It is noted that static voltage drops, inaccuracies of a supply voltage provider (and especially a supply voltage regulator)

can be solved by applying prior art methods such as but not limited to increasing the level of the supply voltage.

FIG. 1 is an example of an embodiment of device 10.

Device 10 can be a mobile device such as a cellular phone, a music player, a video player, a personal data accessory, and the like.

Device 10 may include one or more integrated circuits and at least one of these integrated circuits can include multiple frequency regions. At least one of these frequency regions should include at least one critical path, at least one replica path, one or more error detections circuits and should receive its own clock signal. For simplicity of explanation the following description will refer to a single frequency domain.

FIG. 1 illustrates device 10 as including two integrated circuits—power management integrated circuit 12 and power consuming integrated circuit 14. Power consuming integrated circuit 14 has a frequency domain that receives supply voltage 111 from power management integrated circuit 12 and also receives clock signal 200 from power management integrated circuit 12.

Power management integrated circuit 12 includes clock signal provider 120, supply voltage provider 130 and controller 140. Controller 140 is connected to clock signal provider 120 and supply voltage provider 130. Controller 140 is configured to determine the timing parameters (frequency, delay) of the clock signal that is provided to power consuming integrated circuit 14 and the level of supply voltage to be provided to power consuming integrated circuit 14. If power consuming integrated circuit 14 includes multiple frequency domains the determination is made per frequency domain.

Power consuming integrated circuit 14 can include one or more processors that can change their power consumption to accommodate changes in their computational loads. The power consuming integrated circuit 14 can operate in multiple operational modes wherein at least one is a low power consumption mode. Controller 140 can set the level of the supply voltage and, additionally or alternatively, alter timing parameters of clock signal 200 in response to the computational load of these one or more processors.

Device 10, and especially power consuming integrated circuit 14, includes a large number of paths denoted 20. A small fraction of these paths are critical paths such as critical paths 30, 32, 34 and 36 and replica paths such as replica paths 40, 42, 44 and 46. Error detection circuits 50, 52, 54, 56 are connected to pairs of critical paths and replica paths.

The inputs of critical paths 30, 32, 34 and 36 are connected to input latches 60, 62, 64 and 66 respectively. The inputs of replica paths 40, 42, 44 and 46 are also connected to input latches 60, 62, 64 and 66 respectively. The outputs of critical paths 30, 32, 34 and 36 are connected to output latches 70, 72, 74 and 76 respectively. The outputs of replica paths 40, 42, 44 and 46 can be connected to output latches such as output latches 80, 82, 84 and 86 but this is not necessarily so. For example—the outputs of replica paths can be connected only to error detection circuits—as illustrated in further details in FIG. 2.

Error detection circuit 50 compares between an output signal of critical path 30 and an output signal of replica path 40 or between samples of these output signals. Error detection circuit 52 compares between an output signal of critical path 32 and an output signal replica path 42 or between samples of these output signals. Error detection circuit 54 compares between an output signal of critical path 34 and an output signal replica path 44 or between samples of these output signals. Error detection circuit 56 compares between an output signal of critical path 36 and an output signal replica path 46 or between samples of these output signals. A mismatch between the compared signals is indicative of a fast voltage drop induced timing error.

Each error detection circuits out of 50, 52, 54 and 56 can send an error detection signal to clock signal provider 120, and additionally or alternatively, to error detection logic 90. Error detection logic 90 can receive the one or more error detection signals and can generate a clock signal delay request to clock signal provider 120. Error detection logic 90 can apply a predefined function on one or more error detection signals before outputting such as request.

Error detection logic 90 can request clock signal provider 120 to provide a delayed clock signal if either one of error detection circuits 50, 52, 54 and 56 sends it error detection signals. It can perform an AND logic operation on these error detection signals.

The clock signal delay request can trigger power management integrated circuit 12 to change the supply voltage (and frequency of clock signal 200). For example—if the error rate exceeds a certain threshold the supply voltage (and frequency of clock signal) can be raised. It is further noted that the error detection signals of error detection circuits 50, 52, 54 and 56 can be provided to power management integrated circuit 12.

It is noted that the power management integrated circuit 12 can tolerate certain error rates before increasing the supply voltage or the frequency of clock signal 200. The tolerated error rates can be determined in view of a timing penalty imposed due to the errors and in view of power consumption factors.

Figure 2:
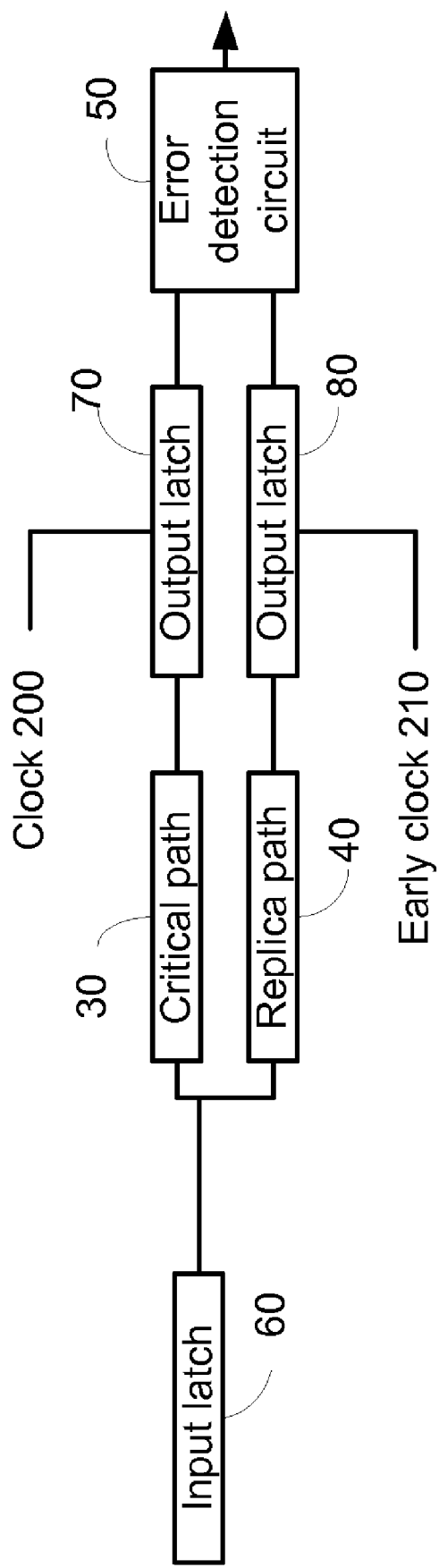
FIG. 2 illustrates an example of an embodiment of a critical path, a replica path, an input latch, output latches and an error detection circuit.

FIG. 2 illustrates an example of an embodiment of critical path 30, replica path 40, input latch 60, output latch 70, output latch 80 and error detection circuit 90. Input latch 60 is connected to the inputs of critical path 30 and replica path 40. The output of critical path 30 is connected to output latch 70 while the output of replica path 40 is connected to output latch 80. Error detection circuit 90 is connected to the outputs of output latches 70 and 80. Output latch 80 can be clocked by a clock signal (denoted "early clock signal" 210) so that is can sample the output of replica path 40 slightly before output latch (clocked by clock signal 200) samples the output of critical path 30.

Error detection circuit 90 compares between the sampled signals. It can detect fast voltage drop timing errors if the samples differ from each other. The samples can be taken at a timing difference that is a small fraction (for example—about 10%) of the clock cycle.

It is noted that both output latches 70 and 80 can be clocked by the same clock signal.

Figure 3:
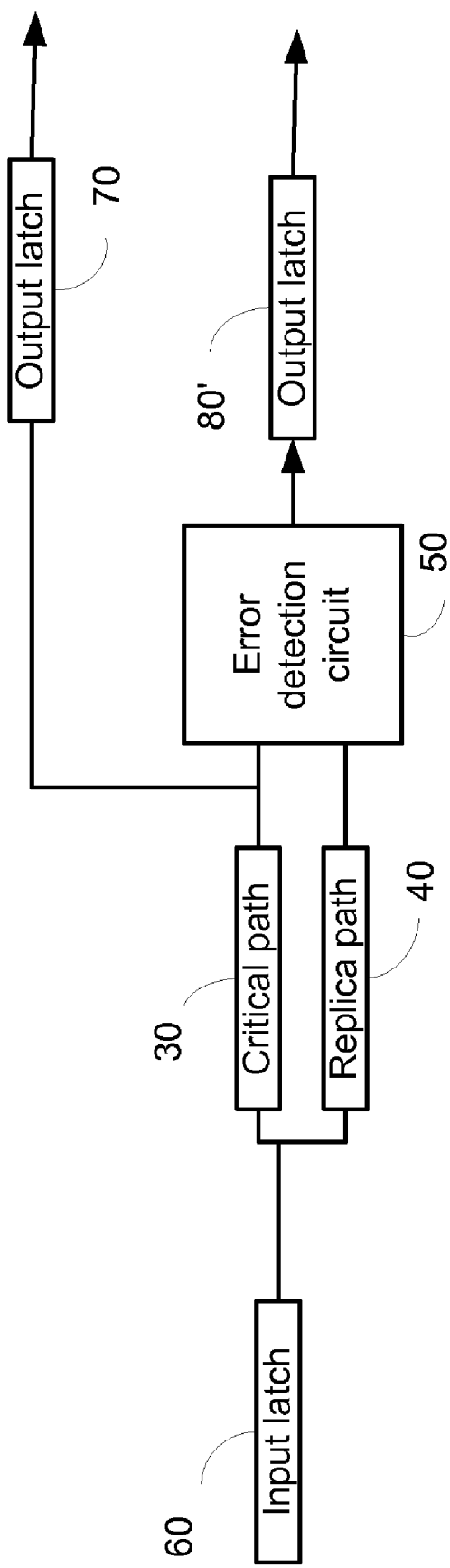
FIG. 3 illustrates an example of an embodiment of a critical path, a replica path, an input latch, output latches and an error detection circuit.

FIG. 3 illustrates an example of an embodiment of critical path 30, replica path 40, input latch 60, output latch 70, output latch 80' and error detection circuit 90. Input latch 60 is connected to the inputs of critical path 30 and replica path 40. The outputs of critical path 30 and replica paths are connected to error detection circuit 90. The output of critical path 30 is also connected to output latch 70. The output of error detection circuit 90 is connected to output latch 80'.

Error detection circuit 90 compares between the signals that are outputted by critical path 30 and replica path 40. It can detect fast voltage drop timing errors if the samples differ from each other. Error detection signals from error detection circuit 90 are sampled by output latch 80' and can be sent to error detection logic 90 and, additionally or alternatively, to clock signal provider 120.

Figure 4:
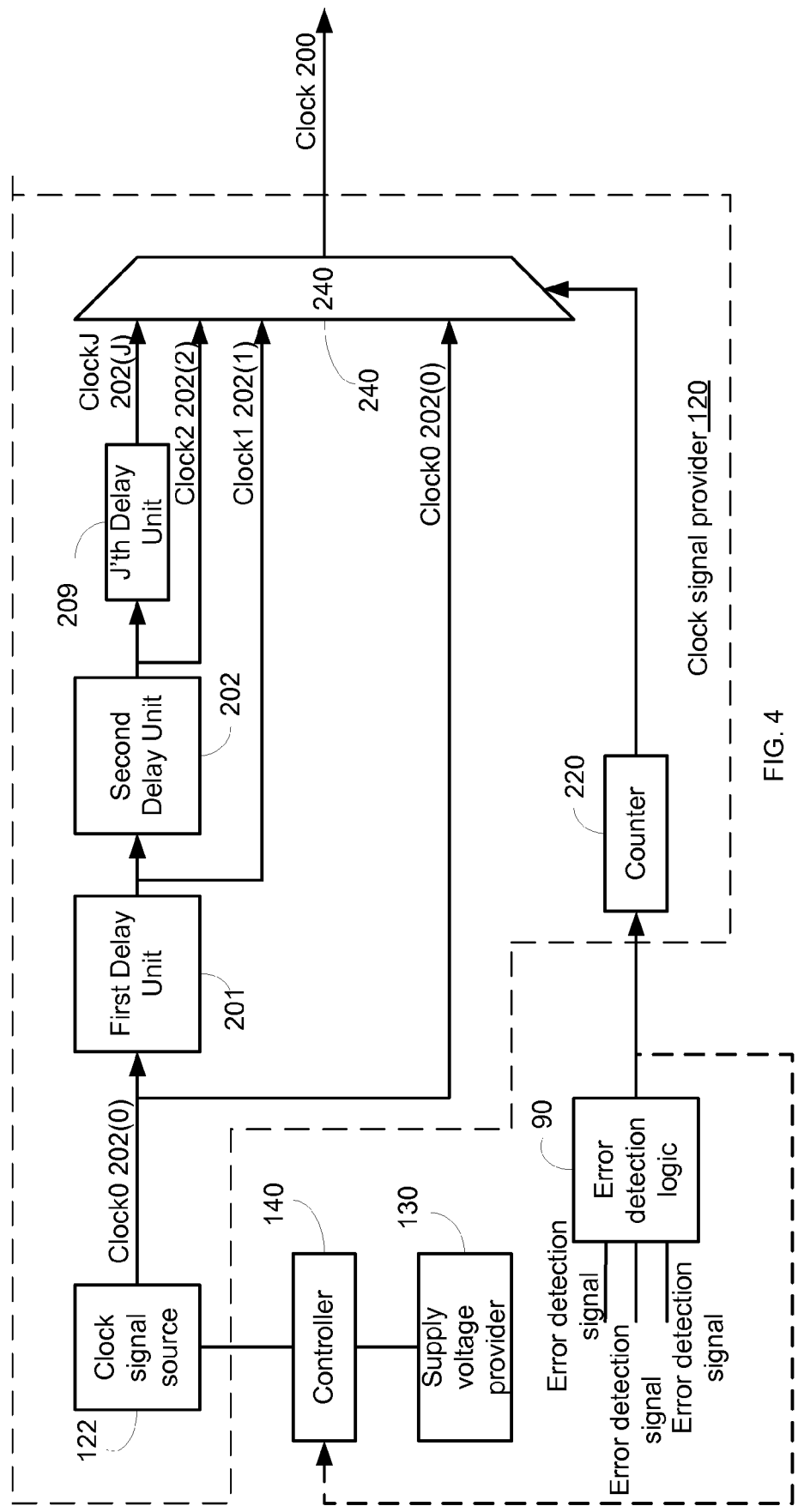
FIG. 4 illustrates an example of an embodiment of a clock signal provider.

FIG. 4 illustrates an example of an embodiment of error detection logic 90, controller 140, clock signal provider 120 and supply voltage provider 130.

Controller 140 is connected to voltage supply provider 130 and to clock signal provider 120. For simplicity of explanation load indications provided from power consuming integrated circuit 14 are not shown.

Clock signal provider 120 receives or generates an input clock signal denoted clock0 202(0). FIG. 4 illustrates clock0 202(0) as originating from clock signal source 122. Clock signal provider 120 also receives a request to delay a clock signal from error detection logic 90.

Clock signal provider 120 can output clock0 202(0) or a delayed version of clock0. FIG. 4 illustrates J delayed clock signals clock1-clockJ 202(1)-202(J). J is a positive integer. It can be equal to ten but this is not necessarily so. Each delayed clock signal is delayed (in relation to clock0) by a different delay period. The timing differences between consecutive delayed clock signals can be equal to each other but this is not necessarily so.

Clock signal provider 120 includes multiple delay units (such as delay units 201, 202 and 209) and multiplexer 240. The delay units are arranged in a sequence and the output of each delay unit of the sequence is also connected to an input of multiplexer 240. The sequence receives clock0 202(2) and provides delayed clock signals clock1-clockJ to multiplexer 240. Multiplexer 240 is controlled by counter 220 that selects between the delayed clock signals and clock0.

A new clock signal (out of clock0-clockJ) is selected whenever a request to delay the clock signal is detected. The selected clock signal (the clock signal outputted by clock signal provider 120) is denoted clock signal 200.

If J equals ten then ten different delayed clock signals are provided, spaced apart by about 10% of the clock cycle.

By delaying the clock cycle once a timing error occurs many timing errors can be prevented, as the effective propagation period is slightly expanded. Conveniently, an increment of 10% of the effective propagation period (during error recovery) reduces the error rate by a ration of about 1:10. Conveniently, clock1-clockJ are delayed by delay periods (in relation to clock0) delay1, delay2, ..., delayJ, wherein the delay1<delay2< ... <delayJ. Conveniently, (delay2−delay1)=(delay3−delay2)= ... =(delayJ−delayJ−1).

Counter 220 counts the requests to delay the clock signal and sends a selection signal to multiplexer 240 in order to replace one clock signal by another. It rolls over when it reaches to (J+1). Accordingly, a single clock cycle is required to amend (J+1) errors.

It is noted that other clock signal generators can be provided, including clock signal generators that have a variable delay unit, but this is not necessarily so.

Figure 5:
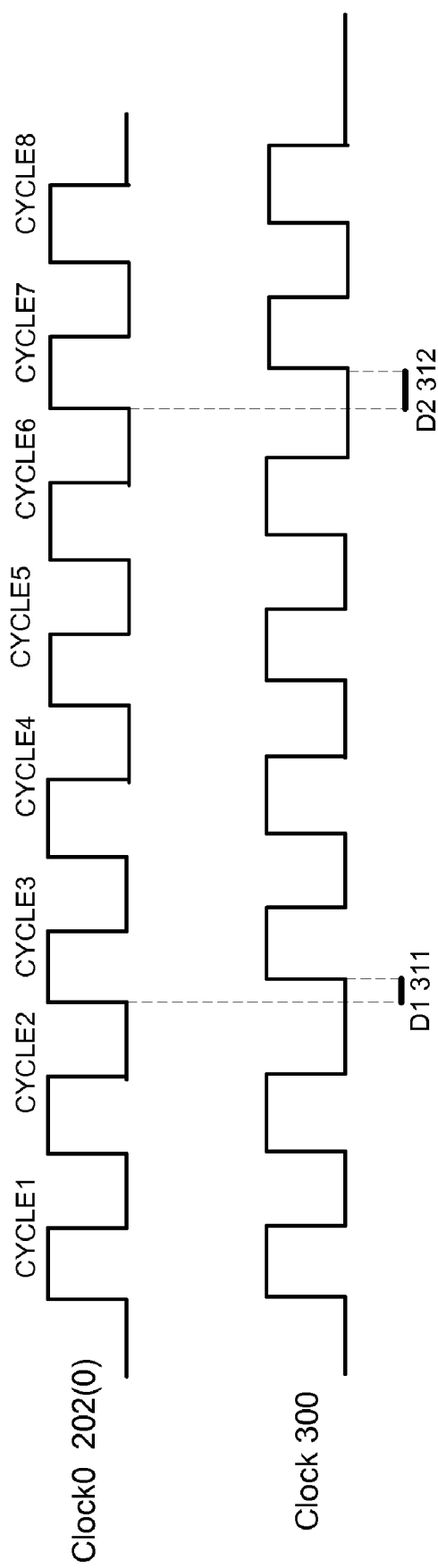
FIG. 5 is an example of an embodiment of a timing diagram of clock signals.

FIG. 5 is an example of an embodiment of a timing diagram illustrating clock signals.

Curve 292 illustrates a Clock0. It is assumed that at CYCLE1 of Clock0 clock signal provider 120 selects to output clock0 202(0). In other words during CYCLE1 and CYCLE2 clock signal 200 equals Clock0 202(0).

Curve 300 illustrates clock signal 200. At CYCLE2 an error was detected as in response clock signal provider 120 selects to provide Clock1 202(1) during CYCLE3-CYCLE6. Clock1 is delayed by D1 311 thus during CYCLE 3 an effective clock cycle of (CYCLE0+D1) is provided. Thus, clock signal 200 equals clock1 202(1).

At CYCLE6 another error is detected and clock signal provider 120 selects Clock2 202(2). Clock2 202(2) is delayed by delay period D2 312 in relation to clock0 202(0). During CYCLE7 and CYCLE8 clock signal Clock2 202(2) is provided to flip-flop 100.

Figure 6:
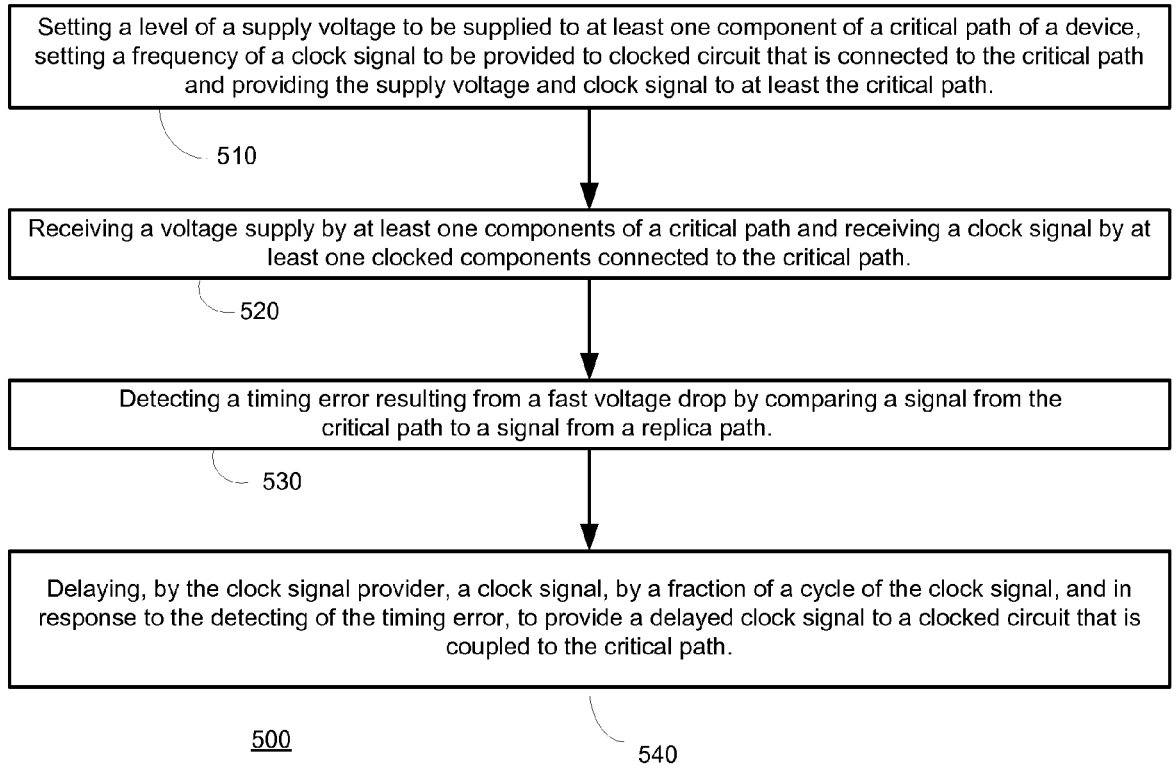
FIG. 6 is an example of an embodiment of a method.

FIG. 6 is an example of an embodiment of a flow chart of method 500.

Method 500 starts by either one of stage 510 and 520.

Stage 510 includes setting a level of a supply voltage to be supplied to at least one component of a critical path of a device, setting a frequency of a clock signal to be provided to clocked circuit that is connected to the critical path and providing the supply voltage and clock signal to at least the critical path.

The setting is responsive to various parameters such as but not limited to a capability of an error detection circuit and a clock signal provider to manage timing errors resulting from fast voltage drops. The error detection circuit can detect timing errors very quickly—in some cases even before the fast voltage drop affects the critical path. The clock signal provider can solve timing errors by slightly delaying the clock signal provided to the device. These capabilities enable a provision of a lower supply voltage in comparison to a scenario in which these timing error detection and clock delay capabilities were used.

The setting is also responsive to the load (or expected load) of a power consuming integrated circuit or of one of its frequency domains.

Stager 520 includes receiving a voltage supply by at least one components of a critical path and receiving a clock signal by at least one clocked components connected to the critical path.

The level of the voltage supply and timing parameters (such as delay and frequency) of the clock signals are set in response to at least one parameter such as a capability of an error detection circuit and a clock signal provider to manage timing errors resulting from fast voltage drops.

Stages 10 and 520 are followed by stage 530 of detecting a timing error resulting from a fast voltage drop by comparing a signal from the critical path to a signal from a replica path.

Stage 530 is followed by stage 540 of delaying, by the clock signal provider, a clock signal, by a fraction of a cycle of the clock signal, and in response to the detecting of the timing error, to provide a delayed clock signal to a clocked circuit that is coupled to the critical path.

Stage 540 can be followed by stage 510 and 520. Stage 510 can include determining a frequency of the clock signal in response to a computational load of a processor of the device and determining the supply voltage in response to the computational load and in response to at least one detected timing error.

Stage 540 includes generating multiple delayed versions of the clock signal and selecting between the delayed versions.

Stage 530 can include detecting, by a plurality of error detection circuits, at least one timing error of at least one critical paths resulting from at least one fast voltage drop. Stage 540 can include delaying the clock signal in response to a detection of a single timing error, in response to a detection of more than a single timing error, and the like.

The number of critical paths can be a small fraction of the overall number of paths.

Stage 530 can include sampling, by the error detection circuit, the signal of the replica path before sampling the signal of the critical path and comparing, by the error detection circuit, between the signals to detect a timing error resulting from a fast voltage drop.

Stage 530 can include comparing between signals provided by a critical path and a replica path that differs from the critical path by at least one parameter selected from a list consisting of delay period and voltage threshold.

Stage 530 can include immediately detecting a timing error. This immediate detection can be contributed by the comparison between the outputs of critical paths and replica paths.

Conveniently, stage 530 can include performing a logical OR operations on multiple error indication signals provided from error detection circuits.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A device, comprising:
    an error detection circuit that is configured to detect a timing error resulting from a fast voltage drop by comparing a signal from a critical path to a signal from a replica path; and
    a clock signal provider that is adapted to receive a clock signal and to delay, by a fraction of the clock cycle and in response to a detection of the timing error, the clock signal to provide a delayed clock signal that is provided to a clocked circuit that is coupled to the critical path; and
    a controller that is configured determine a level of a supply voltage in response to a capability of the error detection circuit and the clock signal provider to manage fast voltage drops;
    wherein the supply voltage is provided to at least one component of the critical path.

2. The device according to claim 1 comprising:
    a plurality of error detection circuits that are configured to detect a plurality of timing errors of a plurality of critical paths resulting from fast voltage drops; and
    wherein the clock signal provider is adapted to delay the clock signal in response to a detection of at least one of the timing errors.

3. The device according to claim 1 comprising:
    a plurality of error detection circuits that are configured to detect a plurality of timing errors of a plurality of critical paths resulting from fast voltage drops; and
    wherein the clock signal provider is adapted to delay the clock signal in response to a detection of a single timing error.

4. The device according to claim 1 comprising:
    multiple paths each coupled between an input latch and an output latch and a plurality of error detection circuits that are configured to detect a plurality of timing errors of a plurality of critical paths resulting from fast voltage drops; and
    wherein a number of the multiple paths is larger than a number of the critical paths.

5. The device according to claim 4 wherein the critical paths are less than one percent of the paths.

6. The device according to claim 1 comprising:
    an error detection circuit that is configured to sample the signal of the replica path before sampling the signal of the critical path and to compare between the samples to detect a timing error resulting from a fast voltage drop.

7. The device according to claim 1 wherein the replica path is slower than the critical path.

8. The device according to claim 1 wherein the replica path comprises transistors that have a higher threshold voltage than transistors of the critical path.

9. The device according to claim 1 wherein the error detection circuit compares between a latched signal provided from the critical path to a latched signal provided by the critical path.

10. The device according to claim 1 wherein the clock signal provider is adapted to alter a delay period by 10% of the clock cycle in response to a detection of a timing error.

11. The device according to claim 1 wherein the clock signal provider comprises multiple delay units and a multiplexer that is adapted to select a clock signal in response to a control signal provided by a counter that counts timing errors.

12. The device according to claim 1 comprising:
    a plurality of error detection circuits that are configured to detect a plurality of timing errors of a plurality of critical paths resulting from fast voltage drops;
    and wherein the clock signal provider comprises multiple delay units and a multiplexer that is adapted to select a clock signal in response to a control signal provided by a counter that counts clock cycles during which timing errors occur.

13. A method, comprising:
- receiving a supply voltage by at least one component of a critical path of a device, wherein the supply voltage is set in response to at least a capability of an error detection circuit and a clock signal provider to manage fast voltage drops;
- detecting a timing error resulting from a fast voltage drop by comparing a signal from the critical path to a signal from a replica path; and
- delaying, by the clock signal provider, a clock signal, by a fraction of a cycle of the clock signal, and in response to the detecting of the timing error, to provide a delayed clock signal to a clocked circuit that is coupled to the critical path.

14. The method according to claim 13 comprising determining a frequency of the clock signal in response to a computational load of a processor of the device and determining the supply voltage in response to the computational load and in response to at least one detected timing error.

15. The method according to claim 13 wherein the delaying comprises generating multiple delayed versions of the clock signal and selecting between the delayed versions.

16. The method according to claim 13 comprising:
- detecting, by a plurality of error detection circuits, at least one timing error of at least one critical paths resulting from at least one fast voltage drop; and
- delaying the clock signal in response to a detection of the at least one timing error.

17. The method according to claim 13 comprising:
- detecting, by a plurality of error detection circuits, a plurality of timing errors of a plurality of critical paths resulting from fast voltage drops;
- wherein the device comprises multiple paths each coupled between an input latch and an output latch and
- wherein a number of the multiple paths is larger than a number of the plurality of critical paths.

18. The method according to claim 17 comprising:
- designing the device to comprise a plurality error detection circuits;
- wherein a number of the error detection circuits is less than one percent of the number of paths.

19. The method according to claim 13 comprising:
- sampling, by the error detection circuit, the signal of the replica path before sampling the signal of the critical path; and
- comparing, by the error detection circuit, between the signals to detect a timing error resulting from a fast voltage drop.

20. The method according to claim 13 comprising:
- comparing between signals provided by a critical path and a replica path that differs from the critical path by at least one parameter selected from a list consisting of delay period and voltage threshold.

* * * * *